United States Patent [19]

Degner

[11] 3,977,130

[45] Aug. 31, 1976

[54] REMOVAL-COMPENSATING POLISHING APPARATUS

[75] Inventor: Raymond L. Degner, Mountain View, Calif.

[73] Assignee: Semimetals, Inc., Mountain View, Calif.

[22] Filed: May 12, 1975

[21] Appl. No.: 576,846

[52] U.S. Cl. .................................. 51/131; 51/236
[51] Int. Cl.² ........................................... B24B 7/04
[58] Field of Search ...................... 51/129, 131, 236

[56] References Cited
UNITED STATES PATENTS

| | | | |
|---|---|---|---|
| 2,378,243 | 6/1945 | Penberthy | 51/131 |
| 3,090,169 | 5/1963 | Boettcher | 51/131 |
| 3,571,978 | 3/1971 | Day | 51/131 |
| 3,579,917 | 5/1971 | Boettcher | 51/131 |
| 3,603,042 | 9/1971 | Boettcher | 51/131 |

Primary Examiner—Al Lawrence Smith
Assistant Examiner—Nicholas P. Godici

[57] ABSTRACT

A polishing apparatus is provided having a flat, stiffly elastic mounting plate for the workpieces. The workpieces are placed in contact with a rotating polishing plate but are kept from rotating along with it by a holder secured to the mounting plate. The flat face of the holder is spaced from the mounting plate. An annular ring is fixed in position between, and in contact with, the face of the holder and the mounting plate. As the workpieces are pressed against the polishing plate by a force transmitted through the holder, the ring, and the mounting plate, the mounting plate assumes a given curvature depending in part on the radius of the ring.

15 Claims, 5 Drawing Figures

REMOVAL-COMPENSATING POLISHING APPARATUS

The present invention relates to a polishing machine, and in particular to improvements for obtaining a uniform removal of material on a workpiece surface.

A conventional polishing machine is comprised of a horizontal polishing plate which is rotated about a vertical axis, a mounting plate having a diameter less than that of the polishing plate, and a holder fixed in position between the polishing plate axis of rotation and its rim for preventing the mounting plate from rotating along with the polishing plate. The workpiece is attached to the underside of the mounting plate and pressed against the polishing plate during the polishing operation by a downward force exerted on the holder.

A major deficiency of such a machine concerns the unequal amounts of material removed from various locations along the workpiece surface. In many situations, it is desirable to have a uniform amount of material removed from the entire workpiece surface. For example, after semiconductor wafers have been produced, they must undergo a polishing step. If too little or too much semiconductor material is removed, the performance of the semiconductor can be deleteriously affected. It has been determined that the removal variation is due in part to the radially increasing velocity gradients between the polishing plate and the workpiece. Other relevant factors are the unit pressure applied along the workpiece surface, the machine geometry, and in chemical-mechanical polishing machines, the type of slurry, the slurry flow rate, and the slurry distribution pattern.

Past attempts at controlling the removal rates are basically of two types. In one type, the workpiece is pressed flush against a flat polishing plate, and the velocity gradient is minimized by 1) using a small diameter mounting plate, 2) mounting the workpieces only toward the outer portion of a relatively large mounting plate, or 3) driving the mounting plate at fixed speed relative to the polishing plate such that the relative velocity between them is a constant across the full area of the mounting plate or varies in a predictable manner. As for the first two approaches, the number of workpieces that can be polished simultaneously is significantly reduced because of the minimal mounting plate surface available. All three approaches have been found deficient in practice, because though the velocity gradient may be reduced, none is designed to adequately compensate for the other factors mentioned above. In the second type, the workpiece is supported at an angle to the polishing plate by 1) machining the curvature into the mounting plate, 2) machining a curvature into the polishing plate, and 3) supporting a flat polishing plate with an annular ring such that it can elastically deflect out of a horizontal plane during the polishing. Though satisfactory results are obtained with this apparatus, machining of the parts is relatively expensive due to the tight dimensional tolerances that must be maintained, and the cost of the polishing operation is thereby increased. Using an annular ring to deflect the polishing plate is impractical because the polishing plate is relatively large. Consequently, the parts needed to support that plate are relatively large and unwieldly. Since the proper size of the ring is determined empirically, production of test models is relatively expensive because of the size of these support parts. Thus, this type of prior art solution of necessity adds significantly to the cost of the polishing operation.

Prior art polishing machines typically utilize a rigid mounting plate-holder combination to maintain the workpiece flush against the polishing plate. In order to accommodate a larger size or a greater number of workpieces, the mounting plates have had to be increased in size. Since rigidity becomes more difficult to maintain as size increases, the thickness of the mounting plates has had to be commensurately increased. Consequently, the weight of the mounting plate has increased to the point where its manipulation by an operator is difficult. Alternatively, a non-rigid, relatively light mounting plate is supported by the entire face of a rigid holder. Deflection of the mounting plate during the polishing is thus minimized by the firm backing support of the holder. This type of design, however, is particularly susceptible to any foreign particles between the holder and the mounting plate because these may cause deflection of the non-rigid mounting plate and consequent misalignment of the contacting surfaces between the workpiece and polishing plate. In addition, the face of the holder must be precision machined to provide uniform support for the flat mounting plate along its entire surface, thereby adding to the cost of the apparatus.

It is the general object of the present invention to provide a polishing machine for accurately producing a desired removal of material along the entire surface of a workpiece.

A more specific object of the present invention is to provide a polishing machine having relatively inexpensive and relatively light-weight parts.

Another object of the present invention is to efficiently utilize the surface area of the mounting plate in a polishing machine.

It is a further object of the present invention to provide a polishing machine less susceptible to foreign particles.

It is yet another object of the present invention to provide a polishing machine with parts that are easily and inexpensively adaptable to various types of workpieces or changes in the polishing process.

In accordance with these objects, a polishing machine is provided having an elastic mounting plate for the workpieces. The workpieces are pressed against a rotating polishing plate by a force transmitted through the mounting plate. A holder retains the mounting plate in fixed position as the polishing plate rotates under it. The force is transmitted to the mounting plate from the holder by a polygon-shaped part, preferably a ring, between it and the holder. As a result, the mounting plate is caused to deflect into a predetermined curvature during the polishing process. The curvature of the mounting plate controls the removal variation while the shape and size of the polygon determine the curvature. The size of the polygon is determined empirically to provide a desired removal rate along the workpiece surface. The parts required to produce test models for a machine utilizing an elastic mounting plate are relatively small and lightweight. Consequently, the expense of producing test models is reduced in comparison with that involved with a machine utilizing a flexible polishing plate which requires relatively large test parts. Furthermore, the elastic mounting plate obviates the need for expensive, precision manufactured parts required in machines utilizing rigid polishing and mounting plates.

To the accomplishment of the above and to such other objects as may hereinafter appear, the present invention relates to the construction of a polishing machine as defined in the appended claims and as described in this specification taken together with the accompanying drawings, in which:

A uniform removal rate is satisfactorily achieved in the prior art by providing a polishing plate or a mounting plate with a curved surface. Such a surface plays an important role in compensating for the various factors mentioned above as affecting the removal rate. However, the prior art approach of machining the curved surface into either the mounting plate or polishing plate is undesirable because precision machining of an angled surface is expensive. The other prior art approach of providing an elastic polishing plate deflected into a particular curvature by a ring pressed against it is also expensive. This is so because the test models required to empirically determine the size of the ring require large parts to cooperate with the large polishing plate and such large parts are costly.

I have found that satisfactory polishing results can be attained economically using a flat mounting plate and a flat polishing plate. A part of a given size and shape is inserted between the mounting plate, which is stiffly elastic, and the holder. The part causes a deflection of the mounting plate during the polishing process. The curvature of the deflection is dependent on the shape, size and location of the part. To provide a uniform removal rate, the part is preferably in the shape of a ring. The ring diameter required to provide this removal rate is determined empirically. Because of the relatively small and inexpensive parts required for changing the ring diameter such a determination can be made inexpensively in comparison with the cost involved in changing or altering the structure taught by the prior art. Also, because the mounting plate and holder need not be rigid, they can be made lightweight for the convenience of the operator and these along with the polishing plate and ring are inexpensive to produce because no costly machining is required.

Figure 1:
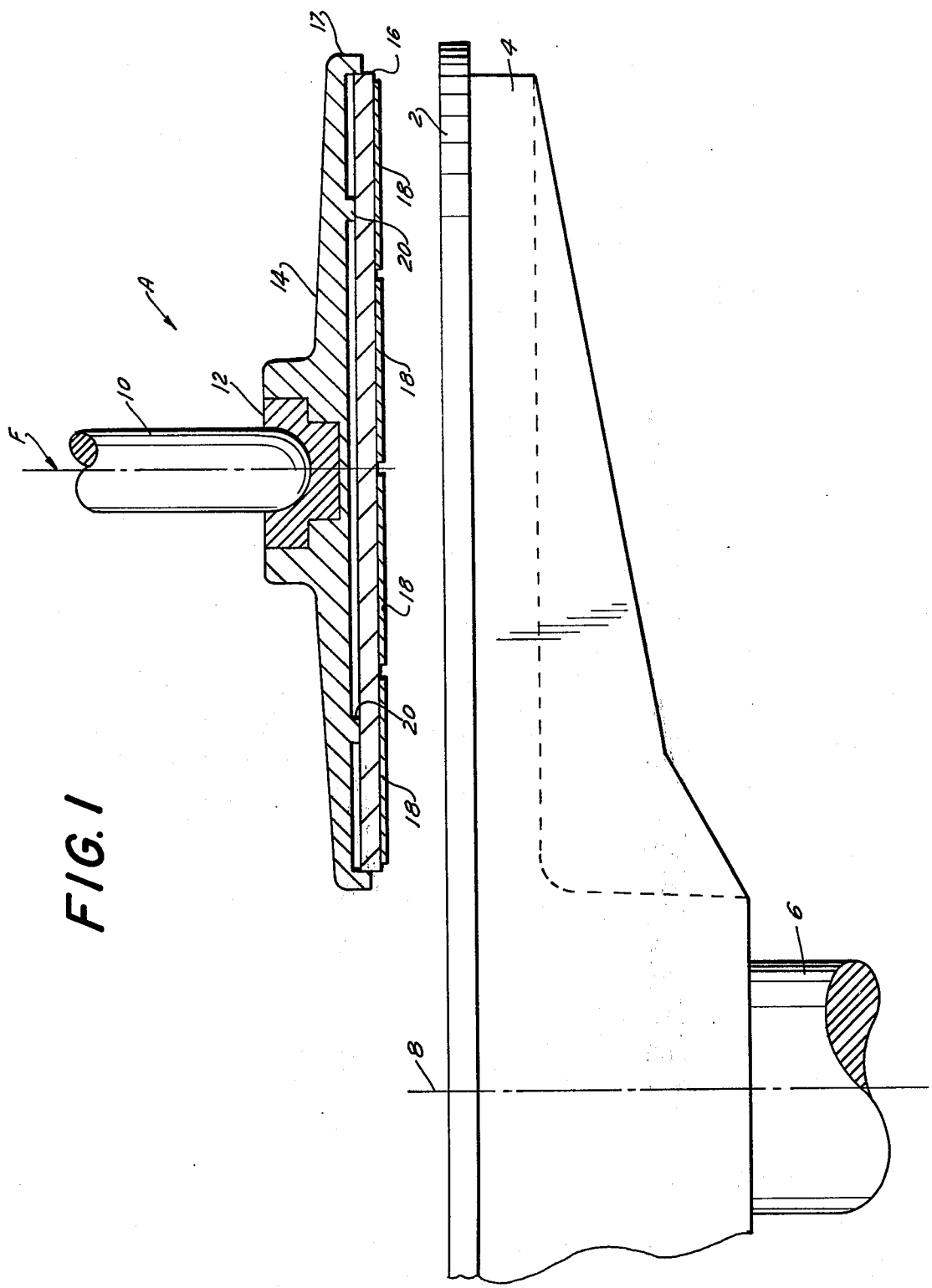
FIG. 1 shows a partially cross-sectional and partially broken-away elevational view of the invention.

Proceeding with a specific description of the present invention, FIG. 1 shows a polishing plate 2 fixedly attached to a rigid turntable 4 which is mounted on a spindle 6. Polishing plate 2 is conventionally made of a "Corfam" plastic having a thickness of approximately 1/16 inch. Polishing plate 2 is rotated during the polishing process at a predetermined speed by a power driving means (not shown) turning spindle 6.

Aligned between axis of rotation 8 of spindle 6 and the outer edge of polishing plate 2 is an assembly A. The standard function of assembly A is three-fold. First, it serves as the support for the workpieces before, during, and after the polishing operation. Second, it transmits a force F to the workpieces to press them against polishing plate 2. Third, assembly A is rotatable, either under power or by autorotation, to reduce the velocity gradient between the polishing plate and the workpieces. These tasks are performed by a spindle 10 attached within a housing 12 (only partly shown). Fixedly attached to housing 12 by conventional means is a holder 14 having a lip 17 around its periphery. The lip 17 fits around mounting plate 16 and is designed to retain it in a fixed position during the polishing operation without exerting any downward force on it. Workpieces 18 are attached to mounting plate 16 in a conventional manner. For example, workpieces 18 are pressed into a melted wax on top of mounting plate 16 and the wax is then allowed to cool. Mounting plate 16 is then inverted and placed on top of polishing plate 2 with workpieces 18 resting flatly on plate 2.

Figure 3:
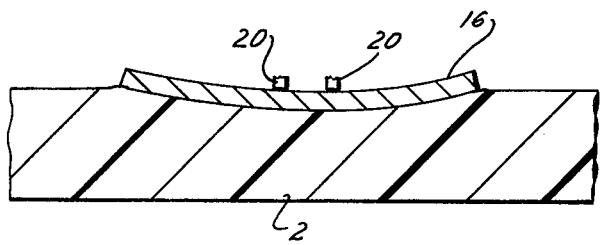
FIG. 3 shows the curvature of the mounting plate using a small diameter ring.
Figure 4:
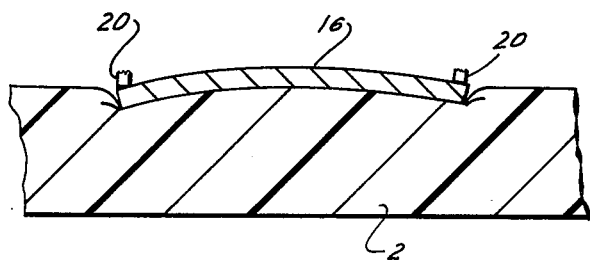
FIG. 4 shows the curvature of the mounting plate using a large diameter ring.
Figure 5:
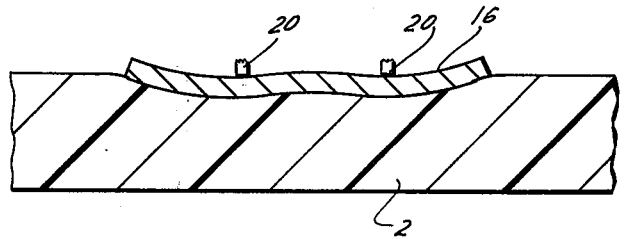
FIG. 5 shows the curvature of the mounting plate using an intermediate diameter ring.

Up to this point, the described apparatus is rather of a conventional nature with a flat mounting plate being used in combination with a flat polishing plate. However, for the reasons described in detail above, such an arrangement does not provide a uniform removal rate. Consequently, my invention utilizes a unique arrangement to provide the curved surface essential in providing a uniform removal rate. In particular, a ring 20 is attached to holder 14. Thus, as holder 14 is lowered toward mounting plate 16, force F will be transmitted to mounting plate 16 only through ring 20. The purpose in using ring 20 rather than the entire face of holder 14 to transmit force F is to cause mounting plate 16 to deflect into a particular curvature. Given the fact that mounting plate 16 is deflectible, the type of curvature resulting from the use of ring 20 is dictated by the diameter of ring 20. As seen in FIG. 3, a relatively small ring diameter results in a convex curvature whereas, as best seen in FIG. 4, a relatively large ring diameter extending to the outer periphery of mounting plate 16 produces a concave curvature. A ring of intermediate diameter produces a complex curvature, as seen in FIG. 5. The plastic of which polishing plate 2 is made yields enough to enable the above curvatures which involve amplitudes of only a few hundredth of an inch. Whereas the type of curvature depends on the ring diameter, the magnitude of curvature depends on 1) the elastic constants of the plate material, 2) the thickness of the plate, and 3) the vertical force F applied through spindle 10. Thus, both the type and magnitude of curvature of the mounting plate 16 can readily and predictably be altered to accomplish the same function achieved with the significantly more expensive techniques of the prior art. The cost reduction is due to the use of relatively small parts requiring little precision machining.

In order for ring 20 to produce the desired curvature of mounting plate 16, the mounting plate must be elastic. However, the material used must be hard enough so that workpieces 18 do not sink into it under the pressures encountered in the polishing process. In addition to these requirements, it is important to keep the weight of mounting plate 16 as low as possible, because it must be manipulated by the operator. In the preferred embodiment, stainless steel is used to provide the requisite hardness. By utilizing a thickness of ¼ to ⅝ inch, the mounting plate is stiffly elastic to enable its deflection for some few thousandths of an inch by the forces provided during the polishing process. Such a relatively thin plate is light enough in the diameters in which it is made to enable its ready manipulation by the operator. The diameter used is 12-⅝ inches, but this dimension is only exemplary with an upper limit of the diameter being imposed by the weight of the mounting plate. Other materials, such as plastic, can be used as long as light weight and stiff elasticity are provided. In accordance with the dimensions of the mounting plate mentioned above, the preferred embodiment utilizes an annular ring 20 having a width of 1/16 to 1 inch and a height from 0.01 inches and up. Basically, the height must be enough to prevent mounting plate 16 from touching holder 14 when it is deflected during the polishing process. The preferred height is 0.03 inches.

The result of using ring 20 in combination with a stiffly elastic mounting plate 16 is a considerable reduction in the cost of the apparatus required to produce a uniform rate of removal. This is due to the fact that a flat polishing plate 2 and a flat mounting plate 16 are used since both are easily and inexpensively manufactured. Holder 14, even with its attached ring 20, is also inexpensive to manufacture, because most of its face need not be precisely machined — only the ring surface engages mounting plate 16. Thus, only the surface of ring 20 requires machining, but this is easily done because only flat surfaces are involved. The cost of holder 14 and its attached ring 20 is important, because this is the part that is empirically varied to produce the desired removal rate. Thus, if a given ring 20 produces a certain undesirable removal rate, the operator must replace it with another. In practice, if say, a smaller diameter produces a further deterioration in the removal rate, then, obviously, a larger diameter should have been used. An experienced operator knows whether a smaller or larger diameter should be used and consequently, the proper dimensions of ring 20 can be quickly determined. Such determination is relatively inexpensive, because as mentioned above, an experimental holder 14 can be quickly produced at relatively low cost.

Besides the cost advantages of this apparatus, the present invention involves several other important advantages. Since the apparatus does not depend upon the rigid mounting plate, holder, or plate-holder combination, and in fact, is based on the existence of the elasticity, both the mounting plate 16 and holder 14 can be much lighter in weight than with prior art apparatus. This becomes particularly significant as the size of the mounting plate is increased to accommodate larger, or greater number of, workpieces since the total weight can still be within the lifting capacity of the operator. Also, the apparatus of the present invention is less susceptible to particles between mounting plate 16 and holder 14 which can misalign the workpieces 18 and provide a faulty workpiece. In contrast to prior art arrangements where the entire holder is in contact with the mounting plate, in my apparatus the particles can have no effect unless present between ring 20 and mounting plate 16. Because this area is so small, chances of their affecting the polishing process are greatly decreased. However, even should particles exist between these contacting surfaces, their effect is rapidly minimized during the polishing process, because mounting plate 16 rotates relative to holder 14 during the polishing operation. Such rotation is enabled by virtue of the diameter of lip 17 being slightly larger than the diameter of mounting plate 16 and, thus, there is little interacting force between them other than to retain plate 16 in place. The combination of such relative rotation and the pressure exerted on the particles between ring 20 and plate 16 either finely grinds the particles and/or causes them to move away from the contacting surfaces. Furthermore, a soft pad on the ring 20 can be used to prevent metal-to-metal contact between the plate and holder to minimize any localized stress concentrations caused by the particles.

The design of the present invention significantly increases its versatility. For example, any process change which results in a changed rate of removal, such as change of the chemical used, can be compensated for by replacing the relatively inexpensive holder 14 with its attached ring 20 rather than modifying or replacing the relatively expensive machined mounting plate or polishing plate used in prior art machines. Also, use of the machine is not restricted to polishing, with sanding, grinding, and lapping being examples of other shaping processes in which the invention can be applied. Furthermore, a workpiece can be shaped to a desired curvature merely by selecting an appropriate diameter for ring 20. In fact, should a non-uniform shape be desired, a part other than a ring can be used to deflect mounting plate 16 into a particular curvature 16. Of course, the size and shape of the part must be determined empirically.

It should be noted that ring 20 need not be attached to holder 14 in order for the invention to operate properly. Ring 20 can be a part of mounting plate 16 or can be a separate part retained in place during the polishing process by a groove on either the holder or the mounting plate. Furthermore, the shape of ring 20 can be altered to quite an extent without affecting proper operation of the apparatus. In fact, the ring 20 may be any closed geometric figure e.g., a polygon or circle even one with some interruptions in its periphery. The discontinuities at the points where the sides of the polygon join and even the discontinuities due to relatively small interruptions in the periphery of the polygon have no deleterious effect in the smoothness of the curvature of mounting plate 16 since the characteristics of the mounting plate are such as to be insensitive to such discontinuities. Though a wide variety of geometrical shapes is usable, should a uniform removal rate be desirable, a regular polygon of a particular size, i.e., one with equal sides with an empirically determined length separated by equal angles, must be used so that the curvature of mounting plate 16 is uniform around the circumference of each concentric circle. The shape of a circular ring is preferable, because it is relatively inexpensive to produce.

As far as holder 14 is concerned, it can also be made of a stiff elastic material so that its deflection is superimposed on that of mounting plate 16. Of course, this must be taken into account in determining the characteristics of mounting plate 16 and the dimensions of ring 20 to obtain the desired removal rate.

Figure 2:
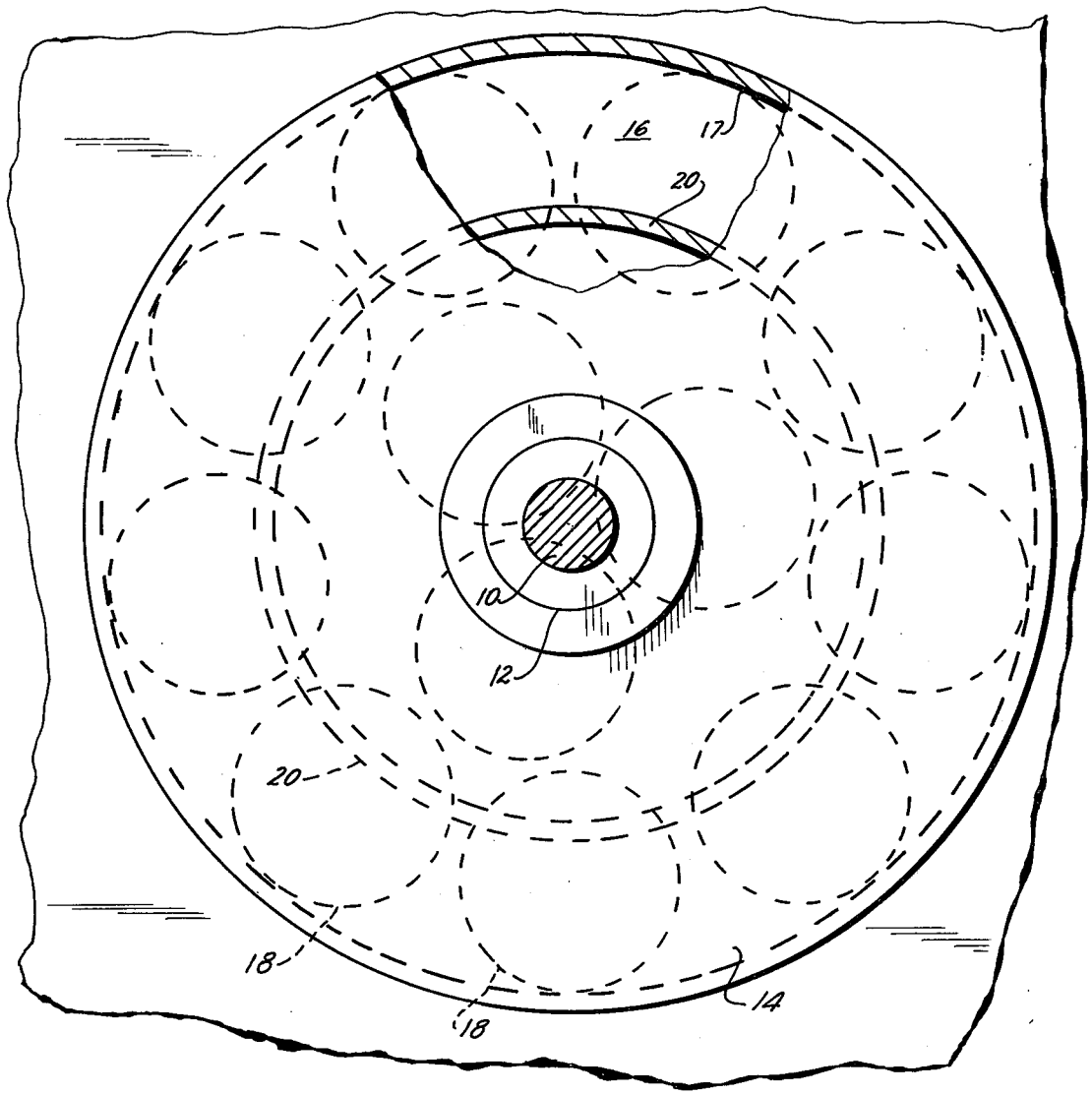
FIG. 2 shows a partially broken-away plan view of the present invention.

One possible arrangement of workpieces 18 on mounting plate 16 is shown in FIG. 2. Workpieces 18 are mounted in two circular rows with the number of rows being dependent on the relative size of mounting plate 16 and workpieces 18. With the arrangement shown in FIG. 2, the approximate location of ring 20 is as shown in FIG. 2 to provide the complex curvature for mounting plate 16 shown in FIG. 3.

It will be apparent from the foregoing that the advantages of the present invention are achieved by using an annular ring between a stiffly elastic mounting plate and the holder with dimensions of the ring being quickly and easily empirically determinable to provide a particular mounting plate curvature.

While but a single embodiment of the present invention has been here specifically disclosed, it will be apparent that many variations may be made therein, all within the scope of the instant invention as defined in the following claims.

I claim:

1. An apparatus for polishing a workpiece surface comprising:
   a. a substantially flat polishing device;
   b. means to rotate said device about a first axis of rotation;
   c. a rotatable assembly having a second axis of rotation located out of alignment with said first axis comprising:
      1. a stiffly elastic mounting plate having first and second oppositely facing surfaces;
      2. means to attach at least one workpiece to said first surface of said plate, said first surface being substantially flat;
      3. a holder removably secured to and having a surface facing and spaced from said second surface of said plate;
      4. at least one protrusion fixedly positioned between, and having a portion in contact with, said second plate surface and said holder surface; and
   d. means to move said assembly so as to press said workpiece surface against said polishing device
   said at least one protrusion forming plate deforming means whereby said plate is deformed into a curved configuration when said workpiece surface is pressed against said polishing device by said moving means.

2. The apparatus of claim 1, wherein said at least one protrusion is configured and dimensioned to provide a given plate curvature as said plate is pressed against said polishing device by said assembly moving means.

3. The apparatus of claim 1, wherein a portion of said holder surrounds and slidably engages said plate to secure said holder to said plate.

4. The apparatus of claim 1, wherein said at least one protrusion is attached to said holder.

5. The apparatus of claim 1, wherein said at least one protrusion is integral with said holder.

6. The apparatus of claim 1, wherein said rotatable assembly is positioned between said first axis of rotation and the outer edge of said polishing device.

7. The apparatus of claim 1, wherein said holder is stiffly elastic.

8. The apparatus of claim 1, wherein said at least one protrusion substantially defines a substantially closed geometric figure located about said second axis of rotation.

9. The apparatus of claim 8, wherein said substantially closed geometric figure is an annular ring.

10. The apparatus of claim 9 wherein the width of said ring portion in contact with said second plate surface is small relative to said second plate surface.

11. The apparatus of claim 1, wherein the width of said protrusion portion in contact with said second plate surface is small relative to said second plate surface.

12. The apparatus of claim 1 wherein said rotatable assembly is positioned between said first axis of rotation and the outer edge of said polishing device; said holder is stiffly elastic; and said at least one protrusion is configured and dimensioned to provide a given plate curvature as said plate is pressing against said polishing device, said at least one protrusion defining a substantially closed geometric figure located about said second axis of rotation and having said portion in contact with said second plate surface small relative to said second plate surface.

13. The apparatus of claim 12 wherein said substantially closed geometric figure is an annulus.

14. An apparatus for polishing a workpiece surface comprising:
   a. a substantially flat polishing device;
   b. means to rotate said device about a first axis of rotation;
   c. a rotatable assembly having a second axis of rotation located out of alignment with said first axis, comprising:
      1. a stiffly elastic mounting plate having first and second oppositely facing surfaces;
      2. means to attach at least one workpiece to said first surface of said plate, said first surface being substantially flat;
      3. a holder removably secured to and having a surface facing and spaced from said second surface of said plate, a portion of said holder surrounding and slidably engaging said plate to secure said holder to said plate;
      4. at least one protrusion fixedly positioned between, and having a portion in contact with, said second plate surface and said holder surface; and
   d. means to move said assembly so as to press said workpiece surface against said polishing device.

15. The apparatus of claim 14, wherein said at least one protrusion is configured and dimensioned to provide a given plate curvature as said plate is pressed against said polishing device by said assembly moving means.

* * * * *